United States Patent
Müller-Meskamp et al.

(10) Patent No.: US 10,636,876 B2
(45) Date of Patent: Apr. 28, 2020

(54) DEVICES WITH CHANNEL EXTENSION REGIONS

(71) Applicant: GLOBALFOUNDRIES INC., Grand Cayman (KY)

(72) Inventors: Lars Müller-Meskamp, Wallgaesschen (DE); Luca Pirro, Dresden (DE); Edward J. Nowak, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/046,241

(22) Filed: Jul. 26, 2018

(65) Prior Publication Data
US 2020/0035788 A1 Jan. 30, 2020

(51) Int. Cl.
| | | |
|---|---|---|
| H01L 29/00 | (2006.01) |
| H01L 29/10 | (2006.01) |
| H01L 29/78 | (2006.01) |
| H01L 29/51 | (2006.01) |
| H01L 29/49 | (2006.01) |
| H01L 29/66 | (2006.01) |
| H01L 29/167 | (2006.01) |

(52) U.S. Cl.
CPC ........ *H01L 29/1045* (2013.01); *H01L 29/167* (2013.01); *H01L 29/4983* (2013.01); *H01L 29/512* (2013.01); *H01L 29/66659* (2013.01); *H01L 29/7831* (2013.01); *H01L 29/7838* (2013.01)

(58) Field of Classification Search
None
See application file for complete search history.

(56) References Cited

U.S. PATENT DOCUMENTS

| | | | | |
|---|---|---|---|---|
| 5,744,372 A * | 4/1998 | Bulucea | .......... | H01L 21/823807 257/E21.427 |
| 6,246,093 B1 * | 6/2001 | Henrickson | ......... | H01L 29/1045 257/345 |
| 6,746,924 B1 | 6/2004 | Lee et al. | | |
| 6,873,008 B2 * | 3/2005 | Houston | ......... | H01L 21/823456 257/327 |
| 9,165,918 B1 * | 10/2015 | Yang | .................. | H01L 27/0248 |
| 2008/0050882 A1 * | 2/2008 | Bevan | ............... | H01L 21/28167 438/308 |

(Continued)

OTHER PUBLICATIONS

Simoen et al., "The low-frequency noise behaviour of graded-channel SOI nMOSFETs", Solid-State Electronics, vol. 51, 2007, pp. 260-267.

(Continued)

*Primary Examiner* — Evren Seven
(74) *Attorney, Agent, or Firm* — David Cain; Andrew M. Calderon; Roberts Calderon Safran & Cole, P.C.

(57) ABSTRACT

The present disclosure generally relates to semiconductor structures and, more particularly, to devices with channel extension regions and methods of manufacture. The structure includes: a gate structure comprising source and drain regions; and a channel below the gate structure, the channel comprising: a first channel region, adjacent to the source region; and a second channel region, adjacent to the drain region and comprising a lower threshold voltage than the first channel region.

19 Claims, 6 Drawing Sheets

(56) References Cited

U.S. PATENT DOCUMENTS

2009/0134475 A1* 5/2009 Min ................ H01L 29/1045
                                              257/402
2016/0284841 A1* 9/2016 Min ................ H01L 29/1033
2016/0329349 A1* 11/2016 Fechner .......... H01L 27/1203
2017/0200823 A1* 7/2017 Kang ............... H01L 29/0869
2018/0061996 A1* 3/2018 Oh ................... H01L 29/4908
2018/0197971 A1* 7/2018 Zhao ............... H01L 29/66636
2018/0308925 A1* 10/2018 Chen ................ H01L 29/063

OTHER PUBLICATIONS

Dehan et al., "An asymmetric channel SOI nMOSFET for improving DC and microwave characteristics", Solid-State Electronics, vol. 46, 2002, pp. 1005-1011.

\* cited by examiner

DEVICES WITH CHANNEL EXTENSION REGIONS

FIELD OF THE INVENTION

The present disclosure generally relates to semiconductor structures and, more particularly, to devices with channel extension regions and methods of manufacture.

BACKGROUND

For analog or other noise susceptible circuits, a high self gain, i.e., transconductance, over current gain (gm/Id), is beneficial, e.g., to reduce noise. However, devices comprised of silicon on insulator (SOI) materials can have lower drive currents in strong saturation applications compared to BULK devices. For example, a fully depleted SOI material at a relatively low SOI thickness intrinsically has a lower drive current in the high saturation region. In this way, SOI devices can have a relatively lower gm compared to bulk technologies in the high current regime.

In earlier attempts to address these problems, devices can have a locally increased threshold voltage (Vt) adjacent to a source region, resulting in a gm boost. As an example, devices can use a cold implant on the source side to profit from better injection on an asymmetric device. However, all of these devices suffer from lowered mobility due to the relatively high channel doping near the source region, resulting in increased mismatch and noise.

SUMMARY

In an aspect of the disclosure, a structure comprises: a gate structure comprising source and drain regions; and a channel below the gate structure, the channel comprising: a first channel region, adjacent to the source region; and a second channel region, adjacent to the drain region and comprising a lower threshold voltage than the first channel region.

In an aspect of the disclosure, a structure comprises: a gate structure comprising source and drain regions, a gate dielectric and a gate metal; a silicon on insulator (SOI) material below the gate structure; and a channel within the SOI material having a first region with a higher threshold voltage than a second region of the channel.

In an aspect of the disclosure, a method comprises: forming a gate structure over a silicon on insulator (SOI) material and comprising source and drain regions; and doping a region of the SOI material which extends from the drain region to have a lower threshold voltage than another region of the SOI material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
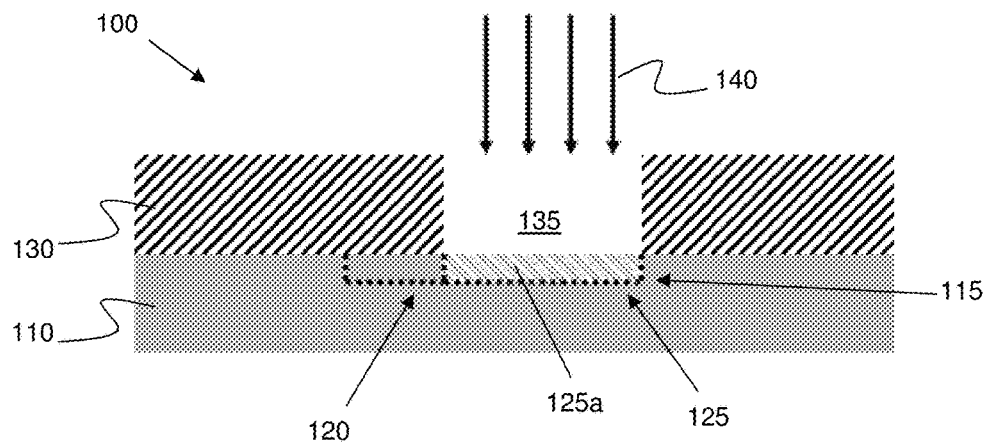
FIGS. 1A-1C show channel regions at a front-gate, amongst other features, and respective fabrication processes in accordance with aspects of the present disclosure.

The present disclosure generally relates to semiconductor structures and, more particularly, to devices with channel extension regions and methods of manufacture. In embodiments, the structures and processes described herein include fully depleted silicon on insulator (FDSOI) or a partially depleted SOI (PDSOI) metal oxide semiconductor field effect transistor (MOSFET), with an ultra-long, ultra-low doped, i.e., hot doping channel region, or a cold channel region, adjacent to the drain (using a pre-gate masked implant, e.g., a threshold voltage (Vt) channel implant).

Advantageously, by implementing the processes herein, the majority of the channel length becomes hot, resulting in a low Vt. Also, advantageously by implementing the structures and processes described herein, devices can be created which have a high current gain (gm) at a custom operation point, thereby reducing input referred noise (1/f) and random telegraph signal (RTS) noise, as needed, e.g., for a comparator in the correlated double sampling (CDS) analog-to-digital (A/D) converter of an imaging sensor circuit, and various analog circuits.

In embodiments, a partial implant can be provided into the channel region of the device to cool or heat parts of the channel region, e.g., by B implant, a $BF_2$ implant, an In implant, a P implant or an As implant, amongst other examples. The resulting transistor will act like a series connection of a short, cold (high Vt) transistor with a long, hot channel (low Vt), thus increasing current gain (gm) at a certain operation range. In an example, the channel implant includes adding an ultra-long, counterdoped channel region, extending from the drain (or source) into the majority of the channel to a FDSOI or PDSOI MOSFET. The doping should be sufficiently low to keep the channel depleted in the OFF state. In further embodiments, the workfunction metal of the gate can be changed to provide the cold and hot regions. In any of the embodiments, most of the channel, i.e., greater than 50% should be hot, while a small portion remains cold.

In further embodiments, a back-gate of the device can cool or heat parts of the channel by a different back-gate doping/potential, extending from the drain or source into the majority (hot) and minority (cold) of the channel of a FDSOI or PDSOI MOSFET. In embodiments, the back-gate can be doped using a pre-gate implant, e.g., well masks. Accordingly, the back-gate can be split, i.e., implanting the back-gate to be cold for a small portion (length) of the channel and hot for a majority of length. In embodiments, the split back-gate will apply a different back bias to different parts of the channel.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii)

applying a patterned mask on top of the films by photolithographic imaging, and (iii) etching the films selectively to the mask.

Figure 1B:
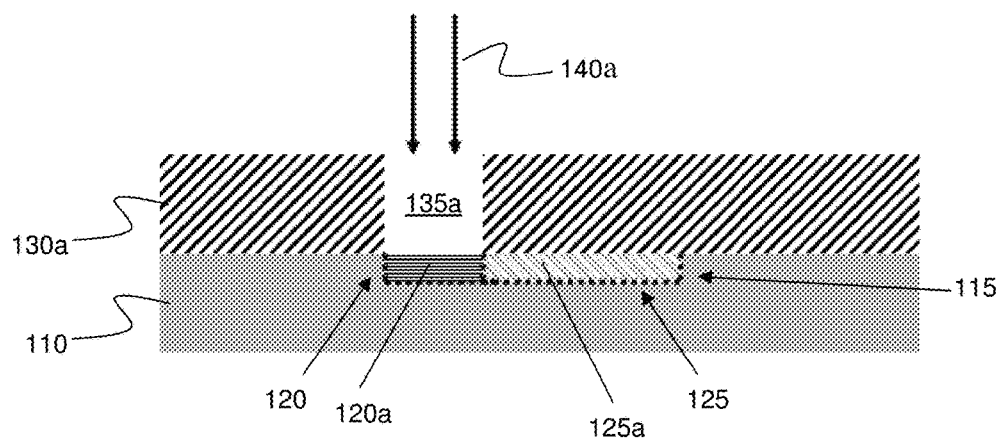
Figure 1C:
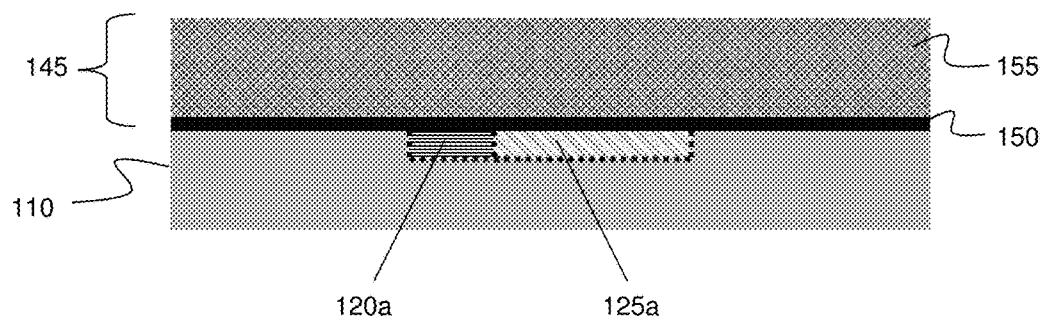

FIGS. 1A-1C show an incoming structure and respective fabrication processes in accordance with aspects of the present disclosure. More specifically, FIG. 1A shows a structure 100 comprising a silicon on insulator (SOI) substrate 110 composed of a suitable semiconductor material. For example, the semiconductor material may be composed of any suitable material including, but not limited to, Si, SiGe, SiGeC, SiC, GaAs, InAs, InP, etc. The substrate 110 can be a fully depleted SOI (FDSOI) or a partially depleted SOI (PDSOI), for example.

In embodiments, the semiconductor material of the substrate 110 can be representative of a fin structure or a planar feature. In embodiments, the fin structure can be fabricated using a sidewall image transfer (SIT) technique. In an example of a SIT technique, a mandrel material, e.g., $SiO_2$, is deposited on the substrate 110 using conventional CVD processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The mandrels are removed or stripped using a conventional etching process, selective to the mandrel material. An etching is then performed within the spacing of the spacers to form the sub-lithographic features, e.g., fin structures. The sidewall spacers can then be stripped.

Still referring to FIG. 1A, a channel region 115 is provided within the substrate 110. In this way, the channel, i.e., channel region 115, is within a silicon on insulator (SOI) material, i.e., substrate 110, where the SOI material is fully depleted or partially depleted. In embodiments, the channel region 115 comprises a first channel region 120 and a second channel region 125 which will be separately doped to form a hot region (hot channel region 125a) and cold region (cold channel region 120a of FIG. 1B). In further embodiments, it is contemplated that the first channel region 120 and the second channel region 125 are not doped, and the hot and cold regions are formed by various techniques, e.g., at the back gate or front gate by changing a workfunction metal, doping of the oxide, and/or by applying a split potential, amongst other examples.

To form the hot channel region 125a, the first channel region 120 is covered by hardmask 130 while the second channel region 125 is exposed to a channel implant, through opening 135. The hardmask 130 can be a hardmask comprised of an inorganic material, e.g., SiN, patterned using conventional lithography and etching processes to form the opening 135 as is known to those of skill in the art such that no further explanation is required herein for an understanding of the present disclosure.

Still referring to FIG. 1A, a doping 140 of the second channel region 125 is performed through the opening 135 to form the hot channel region 125a. In embodiments, the doping 140 can occur prior to gate formation and can by any conventional doping or ion implantation processes. In embodiments, the doping 140 levels are in a range of about $1E13/\mu m^3$-$5E15/\mu m^3$. Further, the doping 140 species can include P, B, In, As, $BF_2$, amongst other examples; although doping 140 is selective to the type of device. For example, an n-type device is doped with a p-type doping; whereas a p-type device is doped with an n-type doping. Since the substrate 110 is either an FDSOI material or PDSOI material, the wells are depleted, hence the hot channel region 125a is counter doped to achieve a local lower Vt, yet still remains depleted in the OFF state, i.e., when there is zero gate voltage. During the doping 140, the first channel region 120 remains protected from the doping 140 by hardmask 130.

In the embodiments of FIGS. 1A-2F, a majority of the channel region 115 is doped to form the hot channel region 125a (although other examples do not require the doping). As an example, greater than 50% of the channel region 115 will be hot, i.e., doped to have a low Vt, while a relatively small portion of the channel region 115 remains cold, i.e., not doped or slightly doped. For example, greater than 70%, but less than a 100%, of the channel region 115 can be doped to form the hot channel region 125a. In this way, an ultra-long, counterdoped channel region, i.e., the hot channel region 125a, is formed extending from a drain or source into a majority of the channel region 115 in a FDSOI or PDSOI MOSFET. More specifically, the second region, i.e., the hot channel region 125a, comprises greater than 50% of the channel, i.e., channel region 115. In this way, the doping 140 comprises more than 50% of a channel within the SOI material. Further, the hot channel doping 140 is sufficiently low to keep the channel region 115 depleted in the OFF state, i.e., when there is zero gate voltage.

Accordingly, the hot channel region 125a is counter doped to achieve a local lower threshold voltage (Vt), yet still remain depleted in the OFF state when there is zero gate voltage. In embodiments, the hot channel region 125a will have a lower Vt (in comparison to the first channel region 120), resulting in a high current gain (gm) for an asymmetric device. In this way, devices comprising an SOI material, such as substrate 110, can achieve a high gm. Additionally, the second channel region 125, i.e., by the hot channel region 125a, remains depleted in an OFF state.

In FIG. 1B, the hardmask 130 is removed and a second hardmask 130a is deposited over the substrate 110 and the hot channel region 125a. The second hardmask 130a can be a hardmask comprised of an inorganic material, e.g., SiN. The second hardmask 130a is patterned to form an opening 135a to expose the first channel region 120. The first channel region 120 is then doped or implanted with a dopant by doping 140a to form the cold channel region 120a, while the hot channel region 125a remains protected by the second hardmask 130a. The cold channel region 120a will be a minority of the length of the channel region 115; whereas the hot channel region 125a is a majority of the length of the channel region 115. In embodiments, the cold channel region 120a will be in a range of greater than about 0% but less than about 50% of the channel region 115. As a specific example, the cold channel region 120a comprises about 10% of the channel region 115; while the remaining portion of the channel is the hot channel region 125a, i.e., about 90%. This configuration will result in a gm boost above approximately 1 µA.

In embodiments, the doping 140a can be implemented by conventional doping processes, e.g., ion implantation processes, amongst other examples. In embodiments, the cold channel region 120a is relatively lightly doped or not doped at all, compared to the hot channel region 125a. In this way, the cold channel region 120a will have a higher Vt than the hot channel region 125a. Further, the doping 140a species can include P, B, In, As, $BF_2$, amongst other examples; although doping 140a is selective to the type of device. For dopings 140, 140a, an n-type device will be doped with a p-type doping, while a p-type device is doped with a n-type doping, i.e., counter doping.

As shown in FIG. 1C, after removal of the second hardmask 130a, gate materials 145, i.e., a gate dielectric 150 and a workfunction metal 155, are deposited over the cold channel region 120a and the hot channel region 125a. In embodiments, the gate materials 145 can be deposited by CVD processes, for example. The gate dielectric 150 can be, e.g., a high-k gate dielectric material such as hafnium based dielectrics. In further embodiments, the high-k dielectric materials can include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The workfunction metal 155 can be any metal material or any combination of metal materials (or polysilicon), depending on the particular application and design parameters.

In embodiments, the workfunction metal 155 can be a tungsten (W) material, lanthanum (La) or aluminium (Al), amongst other examples. Generally, workfunction metals are La or Al on top of HFOx or HfSi, but the structures and processes described herein are not limited to these configurations and/or materials. In further embodiments, the workfunction metal 155 can have different thicknesses or concentrations depending on the particular device parameters. For example, the workfunction metal 155 can be any local gate stack variation between a first channel region, e.g., cold channel region 120a, and a second channel region, i.e., hot channel region 125a, of the channel region 115.

FIGS. 2A-2F show various gate structures formed on the cold channel region 120a and the hot channel region 125a. As should be understood, the gate structures 170, 170a, 170b, 170c, 170d, 170e can be planar gate structures or finFET gate structures. In either scenario, the gate structures 170, 170a, 170b, 170c, 170d, 170e can be fabricated using any known gate formation processes, e.g., replacement gate fabrication processes or gate first processes, as is known in the art.

Figure 2A:
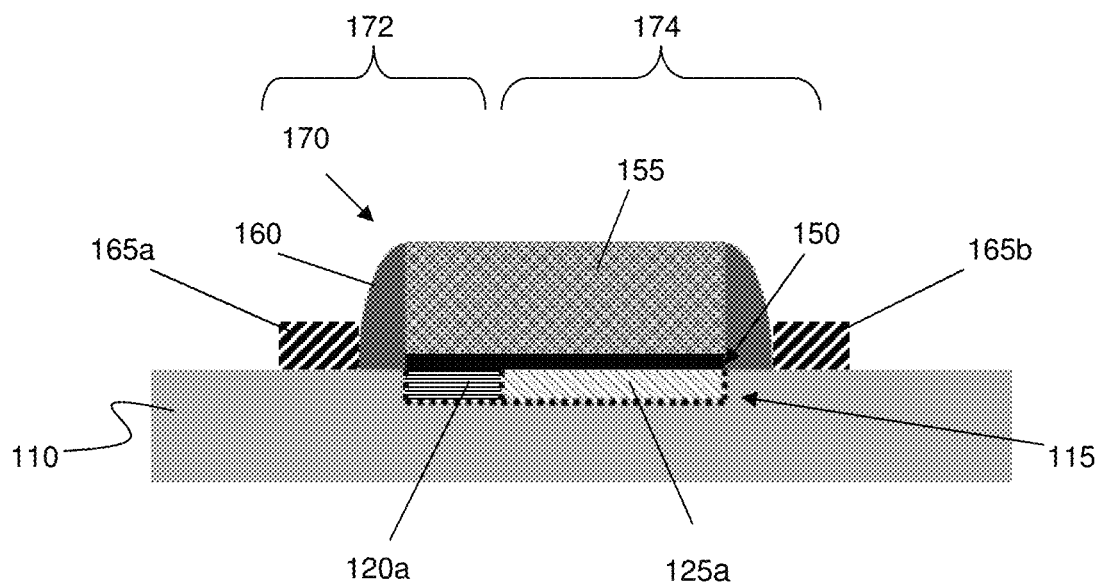
FIGS. 2A-2F show various gate structures at the front-gate, amongst other features, and respective fabrication processes in accordance with aspects of the present disclosure.
Figure 2B:
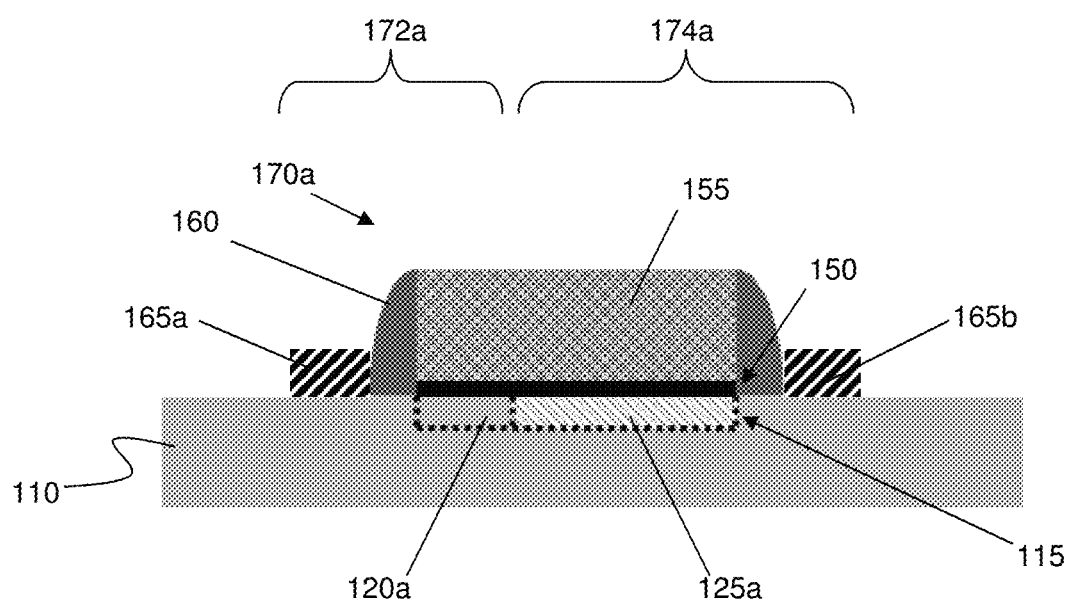
Figure 2C:
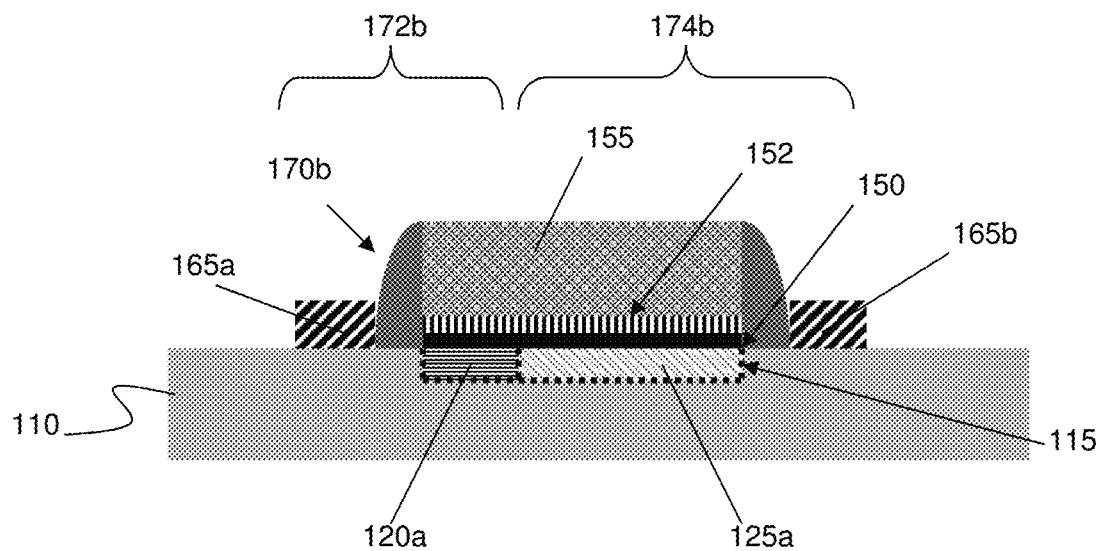
Figure 2D:
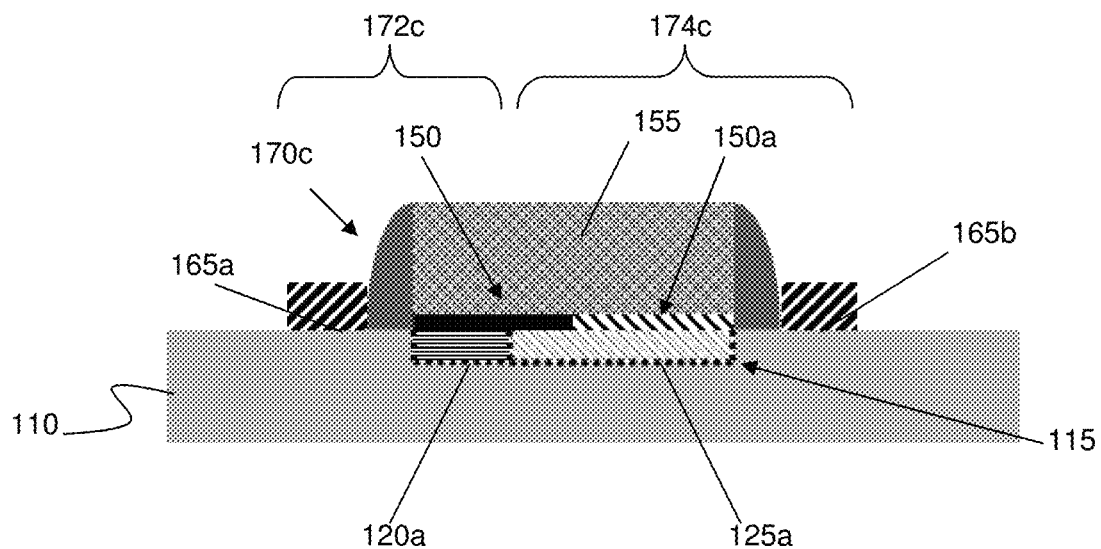

More specifically, FIG. 2A shows the gate structure 170 formed over the cold channel region 120a which is lightly doped, i.e., largely undoped, and the hot channel region 125a. In this way, the first channel region 120 is undoped. More specifically, the first region, i.e., cold channel region 120a, with the higher threshold voltage is undoped. FIG. 2B shows the gate structure 170a formed over the first channel region 120 which is not doped, i.e., an undoped cold channel region 120a, and the hot channel region 125a. In FIG. 2C, a second gate dielectric 152 is stacked over the gate dielectric 150. In this embodiment, the gate materials include a gate dielectric stack comprising the gate dielectric 150 and 152. In FIG. 2D, the gate structure 170c includes a gate dielectric 150a which is fully or partially doped, e.g., using fluorine (F), nitrogen (N), cesium (Cs), or impurity doping, to form a doped gate dielectric 150a over the hot channel region 125a or partially over the hot channel region 125a. In this way, the gate structure 170c comprises a workfunction metal 155 and a gate oxide layer, i.e., gate dielectric 150, which are partially doped, i.e., gate dielectric 150a, with a species of F, N, Cs or In. This will achieve a locally different threshold voltage (Vt) in the cold channel region 120a and the hot channel region 125a of the channel region 115.

Figure 2E:
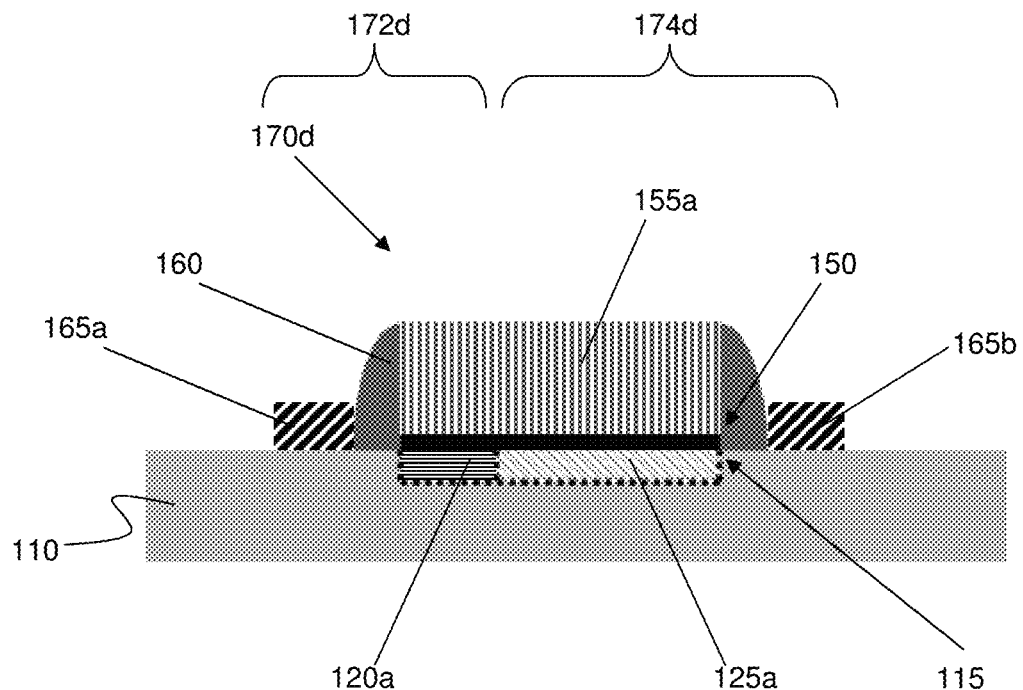
Figure 2F:
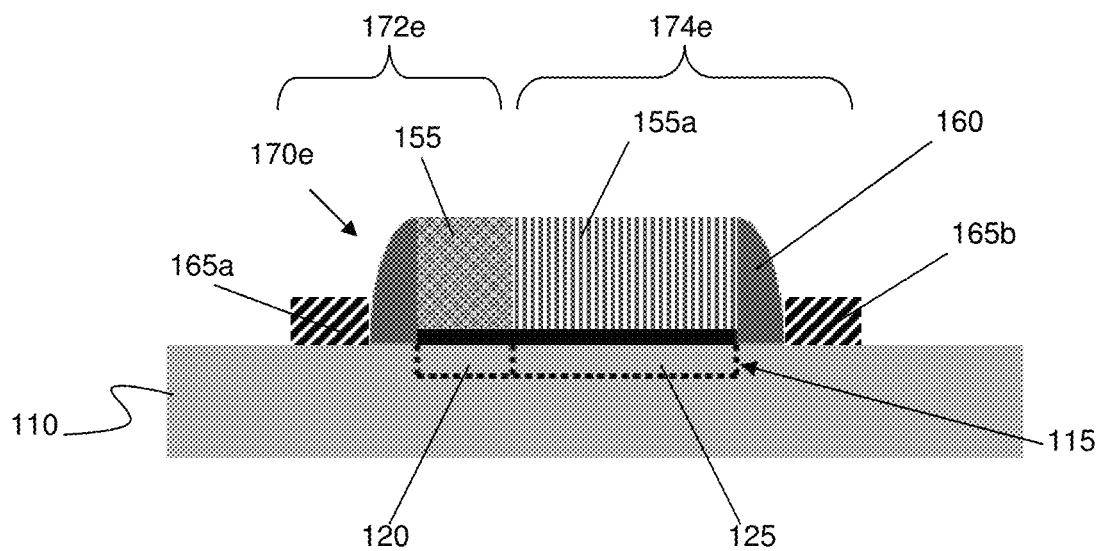

Alternatively, as shown in FIG. 2E, the workfunction metal 155a can be modified for providing a cooling or a heating to the channel region 115. For example, the workfunction metal 155a can be doped with a species of F, N or Cs. Alternatively, in FIG. 2F, the gate structure 170e can be any local gate stack variation comprising the workfunction metals 155, 155a between a first channel region 120, and a second channel region 125, of the channel region 115. In this embodiment, the channel regions 120, 125 remain undoped and become hot and/or cold by splitting the workfunction gate as shown in FIG. 2F. The workfunction metals 155, 155a can have different thicknesses/material ratios between the first channel region 120 and the second channel region 125. In this way, the gate metal, i.e., workfunction metals 155, 155a, comprises more than one workfunction metal having a different thickness or material ratios between the first region, i.e., first channel region 120, and the second region, the second channel region 125.

In FIGS. 2A-2F, sidewall spacers 160, e.g., a low-k dielectric, can be deposited on the sidewalls of the gate structures 170, 170a, 170b, 170c, 170d, 170e. The sidewall spacers 160 can be deposited by conventional chemical vapor deposition (CVD) processes followed by a patterning process, e.g., anisotropic etching process, to remove any material from horizontal surfaces of the structure. Source region 165a and drain region 165b (S/D regions) can be raised S/D regions formed by conventional epitaxial growth processes on the substrate 110. In embodiments, the S/D regions 165a, 165b can be doped by an ion implantation process, a doping process or diffusion processes, as is well known to those of skill in the art such that no further explanation is required for an understanding of the present disclosure. In this way, the structures and processes described herein provide for forming a gate structure, i.e., gate structures 170, 170a, 170b, 170c, 170d, 170e, over a silicon on insulator (SOI) material, i.e., substrate 110, comprising source and drain regions 165a, 165; and doping a region, i.e., hot channel region 125a, of the SOI material, i.e., substrate 110, which extends from the drain region 165b to have a lower threshold voltage than another region, i.e., cold channel region 120a, of the SOI material, i.e., substrate 110.

In embodiments, the S/D regions 165a, 165b are doped with the same dopant as the channel regions, e.g., P, B, In, As, $BF_2$, for example. In this way, the structures and processes described herein provide for a gate structure, i.e., gate structures 170, 170a, 170b, 170c, 170d, 170e, comprising source and drain regions 165a, 165b, a gate dielectric 150 and a gate metal, i.e., workfunction metal 155, a silicon on insulator (SOI) material, i.e., substrate 110, below the gate structure, i.e., 170, 170a, 170b, 170c, 170d, 170e, and a channel, i.e., channel region 115, within the SOI material, i.e., substrate 110, having a first region, i.e., cold channel region 120a, with a higher threshold voltage than a second region, i.e., hot channel region 125a, of the channel, i.e., channel region 115.

The ultralong, ultralow doped (hot doped) channel region, i.e., the hot channel region 125a, is formed adjacent to the drain region 165b so that a majority of the channel length of the channel region 115 becomes hot, i.e., a relatively low Vt. The cold channel region 120a, on the other hand, will be at a higher local threshold voltage (Vt) than the hot channel region 125a. In this way, the structures and processes described herein comprise a gate structure 170 comprising source and drain regions 165a, 165b, a channel 115 below the gate structure 170, with the channel 115 comprising a first channel region 120, adjacent to the source region 165a, and a second channel region 125, adjacent to the drain region 165b, and comprising a lower threshold voltage than the first channel region 120, i.e., the lower threshold voltage provided by the hot channel region 125a by being counter-doped. More specifically, the second channel region 125 is counter doped to have the lower threshold voltage, i.e., the hot channel region 125*a*, and can be counter doped with a species of B, $BF_2$, In, P or As.

As further shown in FIGS. 2A-2F, the first gate regions 172, 172*a*, 172*b*, 172*c*, 172*d*, 172*e* overlap the source of the source region 165*a* and extend partially over the cold channel region 120*a*. The second gate regions 174, 174*a*, 174*b*, 174*c*, 174*d*, 174*e* overlap the drain of the drain regions 165*b* and extend partially over the hot channel region 125*a*. In this way, the first gate regions 172, 172*a*, 172*b*, 172*c*, 172*d*, 172*e* are colder than the second gate regions 174, 174*a*, 174*b*, 174*c*, 174*d*, 174*e*. In embodiments, the second gate regions 174, 174*a*, 174*b*, 174*c*, 174*d*, 174*e* are configured to achieve a flatband voltage differing from that of the first gate regions 172, 172*a*, 172*b*, 172*c*, 172*d*, 172*e* such that a local threshold voltage (Vt) of the channel region 115 below the second gate region, i.e., the hot channel region 125*a*, is lower than that of the first gate regions 172, 172*a*, 172*b*, 172*c*, 172*d*, 172*e*. In this way, the gate structure, i.e., the gate structures 170, 170*a*, 170*b*, 170*c*, 170*d*, 170*e*, comprises a first gate region, i.e., the first gate regions 172, 172*a*, 172*b*, 172*c*, 172*d*, 172*e* extending at least partially over the first channel region 120, i.e., cold channel region 120*a*, and a second gate region, i.e., second gate regions 174, 174*a*, 174*b*, 174*c*, 174*d*, 174*e*, extending at least partially over the second channel region 125, i.e., hot channel region 125*a*.

Figure 3A:
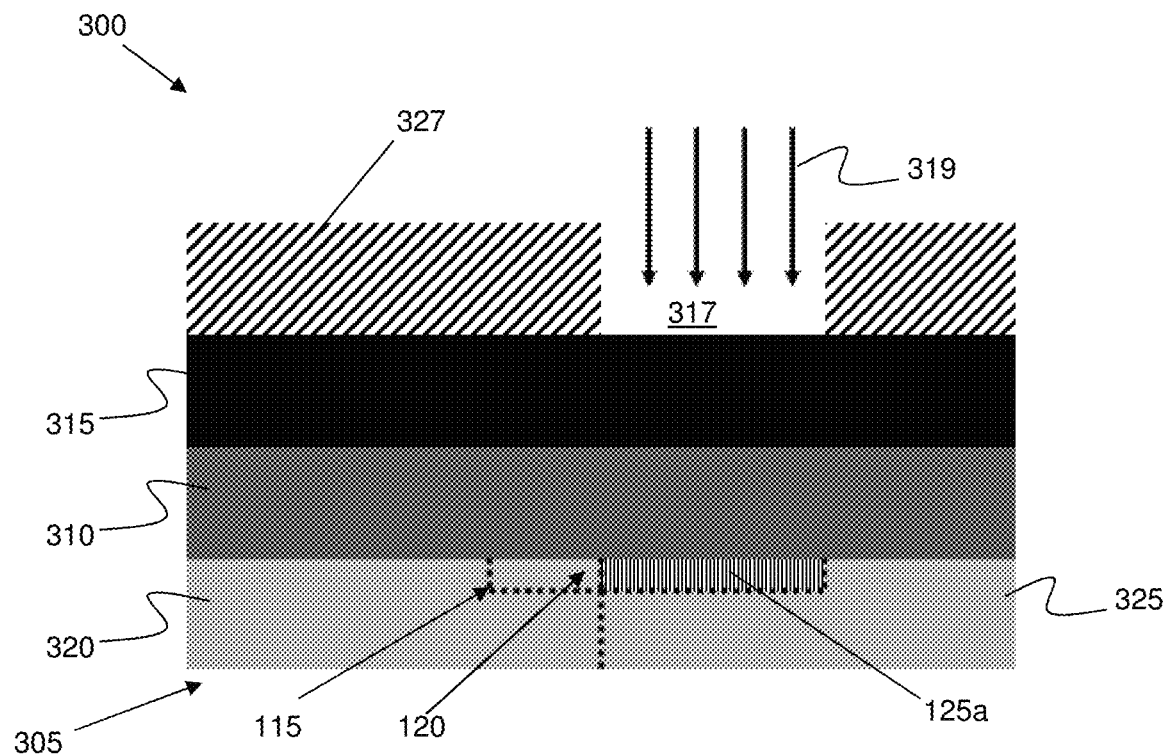
FIGS. 3A-3C show structures at a back-gate, amongst other features, and respective fabrication processes in accordance with aspects of the present disclosure.
Figure 3B:
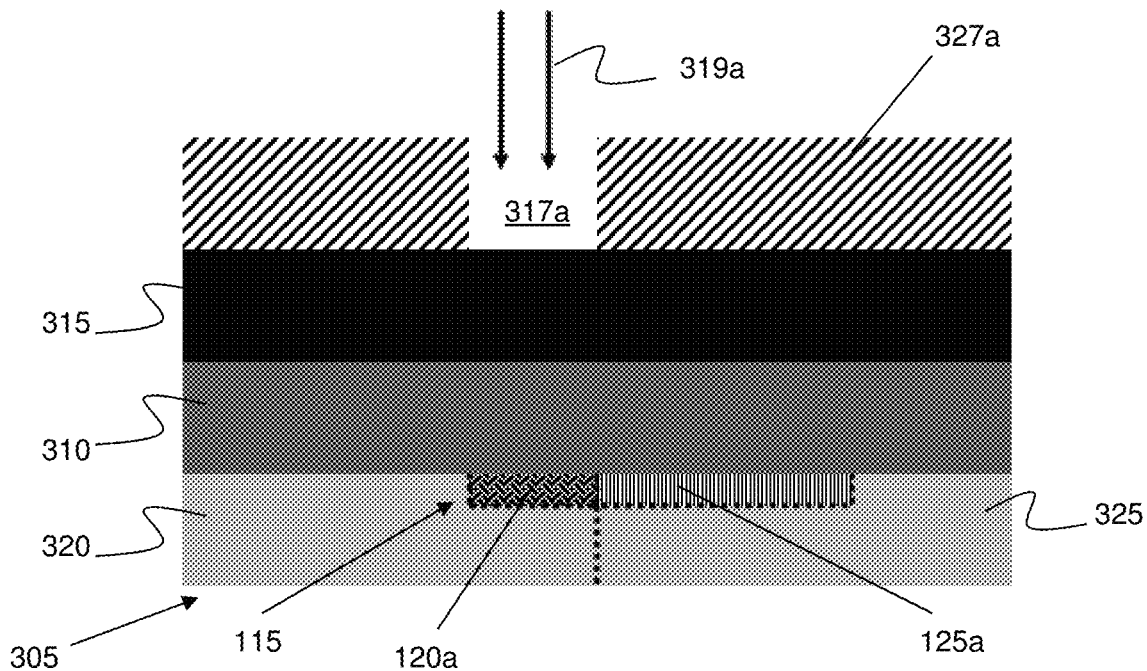
Figure 3C:
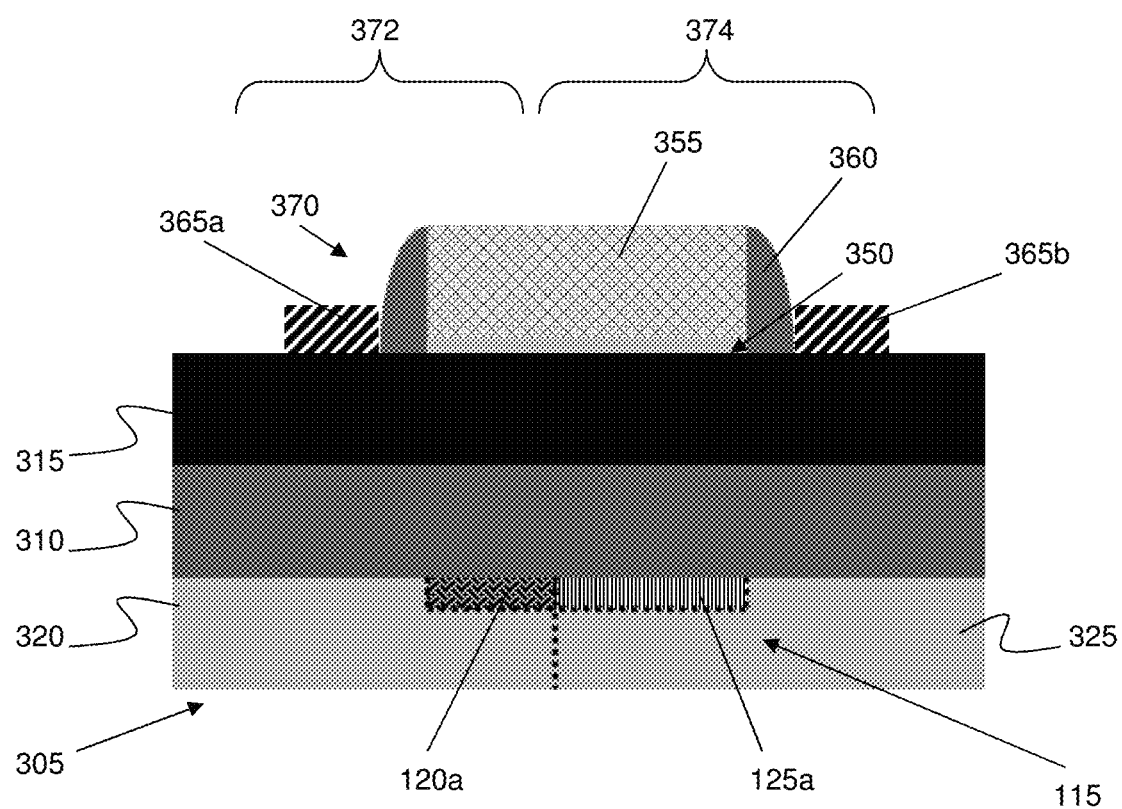

FIGS. 3A-3C show hot channel regions and cold channel regions at a back side of a gate structure. That is, the back-gate can work in conjunction with the structures and processes described in FIGS. 1A-2F of the front gate structure. For example, a cooling or a heating of a part of the channel region 115 can be performed by different back-gate doping or potentials. In these embodiments, the channel region 115 of the substrate 110 can be influenced by manipulation of the back-gate, e.g., by creating a potential in the channel region 115. Formation of channel regions by implementation at the back-gate is especially beneficial, as it does not introduce any dopants to the channel region 115.

FIG. 3A shows an incoming structure 300 which includes an SOI substrate comprising a substrate 305, an oxide material 310 and a semiconductor material 315. In embodiments, the back gate is implanted from a front side into a silicon region below a channel region 115, implanted through the channel region 115 and a buried oxide, i.e., oxide material 310. The gate at a front side of the device is on the surface of the semiconductor material 315. The region below the channel and BOX (buried oxide), i.e., oxide material 310, is implanted and acts as a back gate. The semiconductor material 315 can be any appropriate semiconductor material as described herein, e.g., Si, SiGe, SiGeC, SiC, GaAs, InAs, InP, etc. In embodiments, the semiconductor material 315 can be representative of a fin structure or a planar feature. A p-well 320 is covered by a well hardmask 327 while an n-well 325 is left exposed for implantation. More specifically, the second channel 125, located within the n-well 325, of the channel region 115 is left exposed. A doping 319 of the n-well 325 through the opening 317 forms the hot channel region 125*a*, while the p-well 320 remains protected from the doping 315 by the well hardmask 327.

In FIG. 3B, the well hardmask 327 is removed. As shown in FIG. 3B, a second well hardmask 327*a* is formed over the substrate 305 and the n-well 325. The second well hardmask 327*a* is patterned to form an opening 317*a* over the p-well 320, which is implanted by doping 319*a* to form the cold channel region 120*a* of the channel region 115, while the n-well 325 remains protected from the doping 315*a* by well hardmask 327*a*. In this way, the p-well 320 is under the source region and the n-well 325 is under the drain region. More specifically, the cold channel region 120*a* is adjacent to the source region, while the hot channel region 125*a* is adjacent to the drain.

FIG. 3C show a gate structure 370 formed over the n-well 325 and p-well 320 in accordance with aspects of the present disclosure. Similar to the structures and processes described for FIGS. 1C-2F, the gate structure 370 (e.g., transistors) of FIG. 3C can be comprised of the same materials and be formed by the same processes, e.g., replacement gate fabrication processes or gate first processes known in the art, as recited above for FIGS. 1C-2F. Specifically, a raised source region 365*a* is formed over the p-well 320, while a raised drain region 365*b* is formed over the n-well. Further, a gate dielectric 350 is deposited over the hot channel region 125*a* and the cold channel region 120*a*. A workfunction metal 355 is deposited over the gate dielectric 350. In embodiments, the workfunction metal 355 can be further doped for cooling or heating of the channel region 115. Spacers 360 are formed to complete the gate structure 370.

The gate structure 370 can be split into regions, i.e., a first gate region 372 and a second gate region 374. In embodiments, the first gate region 372 includes the cold channel region 120*a*, while the second gate region 374 includes the hot channel region 125*a*. In this way, there is a back-gate structure 370 below the first channel region 120 and the second channel region 125. Further, the back-gate structure 370 comprises a first back-gate region 372 which overlaps the source region 365*a* and extends at least partially below the first channel region 120, i.e., cold channel region 120*a*, and a second back-gate region 374 which overlaps the drain region 365*b* and extends partially below the second channel region 125, i.e., hot channel region 125*a*. In addition, the second back-gate region 374 is configured to achieve a lower local threshold voltage than the first back-gate region 372.

In FIG. 3C, an n-type device is shown since the n-well 325 is under the raised drain region 365*b* of the source and drain (S/D) regions 365. However, a further embodiment is contemplated in which a lower gradient, i.e., a lower level, of the n-type doping is under the raised drain region 365*b* and a p-type doping is under the raised source region 365*a*, or another embodiment in which an n-type doping is under the raised drain region 365*b* but a lower gradient of the p-type doping is under the raised source region 365*a*. A p-type device is also contemplated, i.e., a p-well under the raised drain region 365*b* of S/D regions 365. Further, for the p-type device, additional embodiments are considered, such as a lower gradient of the p-type doping is under the raised drain region 365*b* and an n-type doping is under the raised source region 365*a*, or another embodiment where a p-type doping is under the raised drain region 365*b* and a lower gradient of an n-type doping is under the raised source region 365*a*.

In embodiments, a different bias, i.e., forward or backward, can be applied to the back-gate to change the potential in the channel region 115. For example, a positive voltage applied to the n-well 325 will cause the second channel region 125 to be hot. In this way, a split back-gate can be achieved for the application of a different back bias to first and a second parts of the channel region 115, i.e., the first channel region 120 and the second channel region 125. In further embodiments, the back-gate is a split back-gate, i.e., electrically separated back-gates for the first channel region 120 and the second channel region 125, with an application of different back-gate voltages to achieve the local threshold voltage difference along the first channel region 120 and the second channel region 125.

FIG. 3C shows a gate structure 370 formed over the p-well 320 and the n-well 325. Further, similar to the embodiments described in FIGS. 2A-2F, different configurations are contemplated. For example, the first channel region the first channel region 120 may not be doped, i.e., an undoped cold channel region. Alternatively, the gate dielectric 350 may be fully or partially doped to achieve a locally different threshold voltage (Vt) in the cold channel region 120a and the hot channel region 125a of the channel region 115. Further, an additional gate dielectric can be stacked over the gate dielectric 350. In further embodiments, the workfunction metal 355 can be partially changed with a new workfunction metal or can be doped.

Any of the structures and processes described for the front-gate side implementation in FIGS. 1A-2F can also be done for the back-gate side implementation of FIGS. 3A-3C. Further, any of the structures and processes described for the back-gate side implementation can also be done for the front-gate side implementation.

The structures and processes described herein avoid the drawbacks of other devices by keeping a channel region adjacent to the source undoped (or very lightly doped) and further reducing the local threshold (potential) of the majority of the channel region adjacent to the drain. In this way, a gm advantage can be achieved without the issues associated with other devices. Specifically, the resulting field effect transistor (FET) acts like a series connection of a short, cold (high Vt) transistor with a long, hot (low Vt) channel region, thus increasing gm at a certain operation range.

Accordingly, by implementing the structures and processes described herein, devices can be created which have a high gm at a custom operation point, thereby reducing input referred 1/f noise and random telegraph signal (RTS) noise, as needed. This is especially beneficial for devices used for a comparator in a correlated double sampling (CDS) analog-to-digital (A/D) converter of an imaging sensor circuit, and other various analog circuits.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a gate structure comprising source and drain regions;
    a channel below the gate structure, the channel comprising:
        a first channel region, adjacent to the source region; and
        a second channel region, adjacent to the drain region and comprising a lower threshold voltage than the first channel region; and
    a back-gate structure below the first channel region and the second channel region.

2. The structure of claim 1, wherein the second channel region is counter doped with respect to the first channel region to have the lower threshold voltage.

3. The structure of claim 2, wherein the second channel region is counter doped with a species of B, $BF_2$, In, P or As.

4. The structure of claim 2, wherein the gate structure comprises a workfunction metal and a gate oxide layer which are partially doped with a species of F, N, Cs or In.

5. The structure of claim 4, wherein the second channel region remains depleted in an OFF state.

6. The structure of claim 5, wherein the first channel region is undoped.

7. The structure of claim 1, wherein the channel is within a silicon on insulator (SOI) material.

8. The structure of claim 7, wherein the SOI material is fully depleted or partially depleted.

9. The structure of claim 1, wherein the gate structure further comprises:
    a first gate region extending at least partially over the first channel region, and
    a second gate region extending at least partially over the second channel region.

10. The structure of claim 9, wherein the second gate region is configured to achieve a flatband voltage differing from that of the first gate region.

11. The structure of claim 1, wherein the back-gate structure comprises:
    a first back-gate region which overlaps the source region and extends at least partially below the first channel region; and
    a second back-gate region which overlaps the drain region and extends partially below the second channel region.

12. The structure of claim 11, wherein the second back-gate region is configured to achieve a lower local threshold voltage than the first back-gate region.

13. A structure, comprising:
    a gate structure comprising source and drain regions, a gate dielectric and a gate metal;
    a silicon on insulator (SOI) material below the gate structure; and
    a channel within the SOI material having a first region with a higher threshold voltage than a second region of the channel, wherein the gate metal comprises more than one workfunction metal having a different thickness or material ratios between the first region and the second region.

14. The structure of claim 13, wherein the gate dielectric is partially doped.

15. A structure, comprising:
    a gate structure comprising source and drain regions, a gate dielectric and a gate metal;
    a silicon on insulator (SOI) material below the gate structure; and a channel within the SOI material having a first region with a higher threshold voltage than a second region of the channel, wherein the first region with the higher threshold voltage is undoped.

16. The structure of claim 15, wherein the second region comprises greater than 50% of the channel.

17. The structure of claim 12, wherein the first channel region comprises greater than 50% of the channel and the back-gate structure heats the first channel region through a potential applied the first channel region.

18. The structure of claim 17, wherein the back-gate structure cools the second channel region through a potential applied the second channel region.

19. The structure of claim 18, wherein the back-gate structure heats a majority of the channel region.

* * * * *